United States Patent
Seckin et al.

(10) Patent No.: US 10,804,912 B2
(45) Date of Patent: Oct. 13, 2020

(54) NON-INTEGER FREQUENCY DIVIDER

(71) Applicant: Apple Inc., Cupertino, CA (US)

(72) Inventors: Utku Seckin, Santa Clara, CA (US); Simone Gambini, San Francisco, CA (US); Benjamin W. Cook, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 66 days.

(21) Appl. No.: 16/057,807

(22) Filed: Aug. 7, 2018

(65) Prior Publication Data

US 2020/0052708 A1    Feb. 13, 2020

(51) Int. Cl.
| | |
|---|---|
| *H03L 7/185* | (2006.01) |
| *H03K 5/135* | (2006.01) |
| *H03L 7/18* | (2006.01) |
| *H03L 7/089* | (2006.01) |
| *H03L 7/093* | (2006.01) |

(52) U.S. Cl.
CPC ............ *H03L 7/185* (2013.01); *H03K 5/135* (2013.01); *H03L 7/0891* (2013.01); *H03L 7/093* (2013.01); *H03L 7/18* (2013.01)

(58) Field of Classification Search
CPC ......... H03L 7/18; H03L 7/0891; H03L 7/093; H03L 7/185; H03K 5/135

USPC ....... 331/16, 74; 377/48; 327/115, 147, 157; 455/260, 255
See application file for complete search history.

(56) References Cited

U.S. PATENT DOCUMENTS

| | | |
|---|---|---|
| 7,756,487 B2 | 7/2010 | Lerner et al. |
| 8,542,616 B2 | 9/2013 | Staszewski et al. |
| 8,890,625 B2 | 11/2014 | Chang et al. |
| 9,143,085 B2 | 9/2015 | Narathong et al. |
| 2014/0327478 A1* | 11/2014 | Horng ................ H03L 7/18 327/157 |

* cited by examiner

*Primary Examiner* — Arnold M Kinkead
(74) *Attorney, Agent, or Firm* — Kowert, Hood, Munyon, Rankin & Goetzel, P.C.

(57) ABSTRACT

A non-integer divider for dividing the frequency of a signal is disclosed. A non-integer divider includes a first divider that divides the frequency of a first signal. A mixer is coupled to receive the first signal, and a second signal having a frequency equivalent to that output by the first divider. The mixer outputs a third signal having a frequency based on respective frequencies of the first and second signal. A second divider receives and frequency divides the third signal to produce a fourth signal. A ratio of the frequency of the first signal to the fourth signal is a non-integer value.

20 Claims, 7 Drawing Sheets

NON-INTEGER FREQUENCY DIVIDER

BACKGROUND

Technical Field

This disclosure is directed to oscillator circuits, and more particularly, frequency dividers used with oscillator circuits.

Description of the Related Art

Voltage controlled oscillators (VCOs) are widely employed in various electronic systems, including wireless transmitters. A VCO generates a periodic signal having a frequency that is proportional to some input voltage. In some wireless transmitter systems, the output signal provided by a VCO may be fed as an input to a power amplifier. Thereafter, the signal may be output from the power amplifier at a frequency that is, e.g., a center frequency for a modulated radio signal.

In some cases, a periodic output signal provided by a VCO may be divided to produce a periodic signal at a different frequency. This division can be performed for various reasons, e.g., to provide a signal at a more suitable frequency than the VCO may produce. Accordingly, a divider circuit may be coupled to a VCO output to produce the periodic signal at the different frequency. These dividers may, in various embodiments, divide the frequency of the VCO output signal by an integer value, or a non-integer value.

SUMMARY

A non-integer divider for dividing the frequency of a signal is disclosed. In one embodiment, a non-integer divider includes a first divider that divides the frequency of a first signal. A mixer is coupled to receive the first signal, and a second signal having a frequency equivalent to that output by the first divider. The mixer outputs a third signal having a frequency based on respective frequencies of the first and second signal. A second divider receives and frequency divides the third signal to produce a fourth signal. A ratio of the frequency of the first signal to the fourth signal is a non-integer value.

In some embodiments, the non-integer divider includes a synchronizer coupled between the output of the first divider and the input of the mixer that is coupled to receive the second signal. A clock input of the divider is coupled to receive the first signal. Additionally, some embodiments include a filter coupled to the output of the mixer, the filter being used to attenuate certain sideband components of the third signal. The resulting non-integer divider may reduce the number and power of undesired frequency spurs associated with the signal output therefrom.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components. etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a non-integer divider that divides the frequency of a signal by a non-integer value. The non-integer divider may be used in various types of systems, including communications system that includes a power amplifier implemented on-chip. In integrating a power amplifier on-chip, one of the key challenges is known as "pulling", which occurs when a high-power transmit output signal or one of its harmonics couples to a source, such as a voltage controlled oscillator (VCO), of the original (pre-divided) signal.

Previously implemented techniques may introduce harmonics at a divider output. These harmonics are highly undesirable for high-power transmitter due to various regulatory and mask limitations of many countries and various wireless standards. Accordingly, the disclosure herein is directed to implementing a very low-super, low power non-integer frequency divider. The low spur power may enable the use of a higher output power and may relax front-end filtering requirements.

In various embodiments, a non-integer divider according to the disclosure includes a first divider arranged to divide a frequency of a first signal, the first signal being an input signal. The non-integer divider also includes a mixer having a first input that receives the first signal and a second input coupled to receive a second signal, wherein a frequency of the second signal is equivalent to a signal output by the first divider. The mixer is outputs a third signal having a frequency based on signals received at its first and second inputs. A filter is provided to attenuate sideband (e.g., upper sideband) components of the third signal. A second divider divides a frequency of the third signal to produce a fourth signal, which is the output signal of the non-integer divider. A ratio of the frequency of the first signal to a ratio of the fourth signal is a non-integer value.

Figure 1:
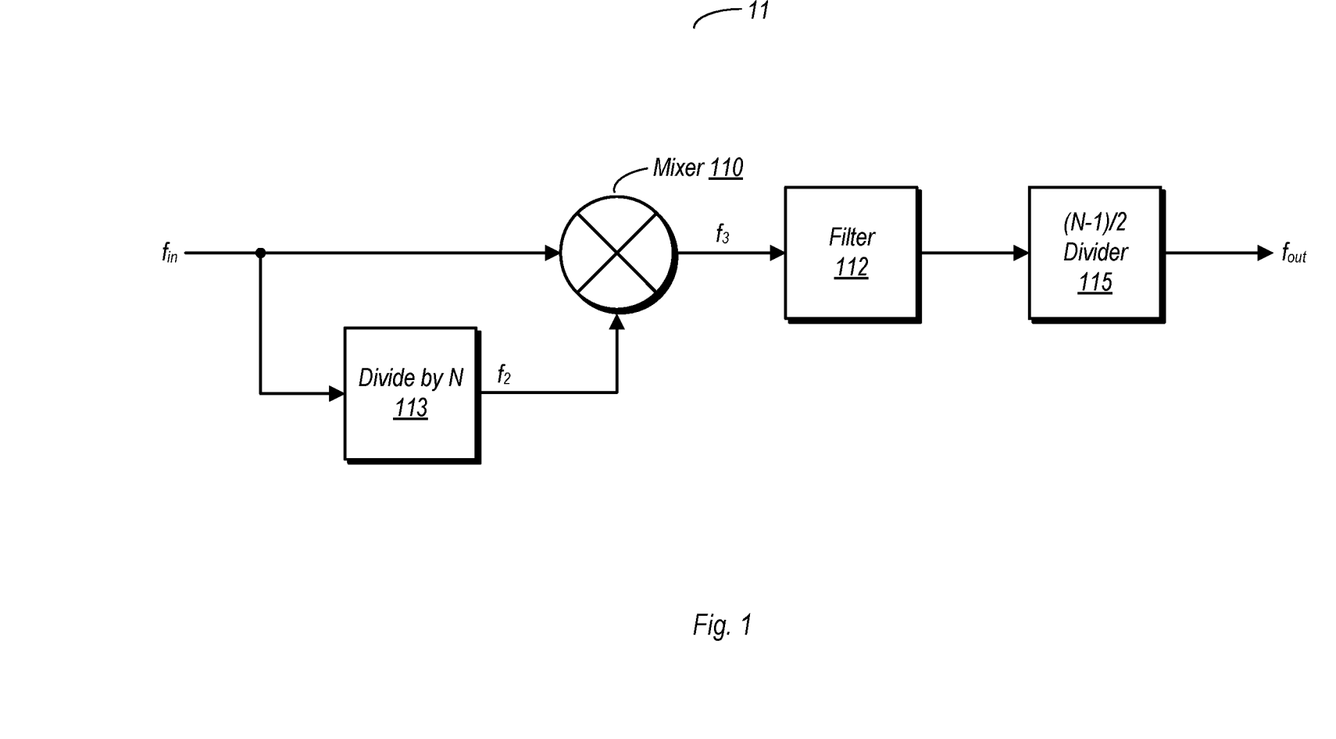
FIG. 1 is a block diagram of one embodiment of a non-integer divider.

FIG. 1 is a block diagram of one embodiment of a non-integer divider. In the embodiment shown, non-integer divider 11 is coupled to receive an input (e.g., a first signal), $f_{in}$, which is received by mixer 110 and a divider 113 (e.g., a first divider). The first divider, divider 113, is arranged to divide the frequency of the first signal by an odd integer value N (e.g., 3, 5, 7, etc.). The output of divider 113 is the second signal $f_2$ that is input into a second input of mixer 110. The output of mixer 110 is one example of a third signal $f_3$ in accordance with the above, and its sideband components are attenuated by filter 112. In the embodiment, filter 112 is a bandpass filter, although embodiments utilizing low pass (to attenuate upper sideband components) or high pass filters (to attenuate lower sideband components) are also possible and contemplated. With respect to the mixer, the output signal produced thereby may have a frequency that is the frequency of the first signal plus the frequency of the second signal $(f_{in}+f_2)$ or the frequency of the first signal minus the frequency of the second signal $(f_{in}-f_2)$. In one embodiment, the signal based on the difference, $f_{in}-f_2$, is the signal passed through filter 112 to second divider 115 and the signal based on the sum, $f_{in}+f_2$, is attenuated by the filter 112.

The output of filter 112, the third signal, is provided to a second divider 115. The second divider is arranged to divide the frequency of the third signal by an even integer value to produce the fourth signal, $f_{out}$. In the embodiment shown, the second divider is arranged to divide the frequency of the third signal by a value of $(N-1)/2$, noting again that N is an odd integer value. For the overall non-integer divider, the ratio of the frequency of the first signal to the frequency of the fourth signal is N/2. For example, consider the frequency of the first signal to be 100 MHz, and N=3. In this scenario, mixer 110 would receive the first signal at 100 MHz, and the second signal at 33.3 MHz. Taking the difference between these two signals as the third signal (at the output of mixer 110), the third signal thus has a frequency of 66.67 MHz. Since N=3, divider 115 effectively is a divide-by-one divider (3−2/2=1). Accordingly, the fourth signal output by non-integer divider has a frequency of 66.67 MHz, and thus the ratio of the input signal frequency to the output signal frequency is 3/2, or 1.5 (100/66.67=1.5). The undesired signal based on the sum, $f_{in}+f_2$, of the mixer 110 input signals would be at 133.3 MHz which is twice the frequency of the third signal (desired signal). The ratio between the desired signal and the undesired signal at the divider 115 output is always 2. In most systems, there is already a large undesired signal at twice the frequency of the desired signal. So, no additional spur frequency is generated at divider 115 output based on the sum, $f_{in}+f_2$, of the mixer 110 input signals.

Figure 2:
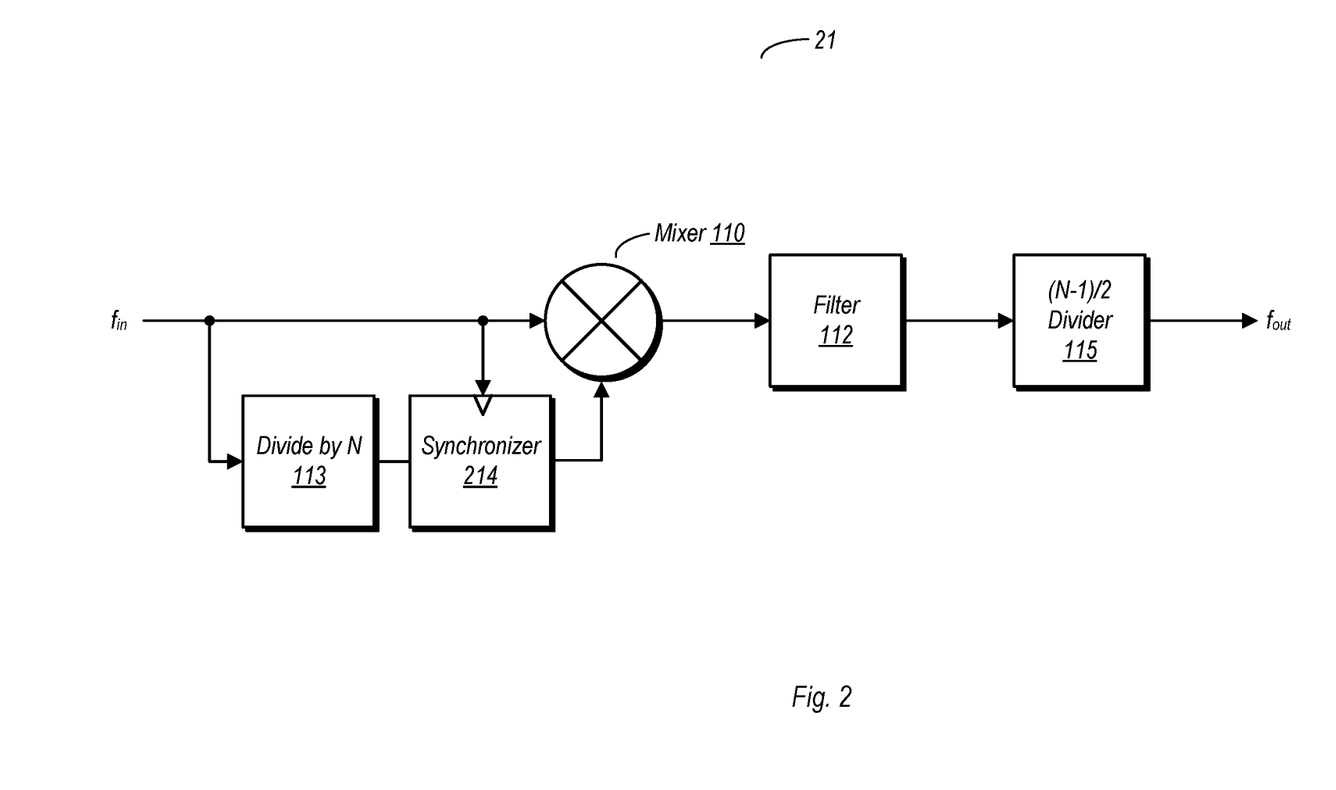
FIG. 2 is a block diagram of another embodiment of a non-integer divider.

FIG. 2 is a block diagram of another embodiment of a non-integer divider. In the embodiment shown, non-integer divider 21 includes all the same components of the embodiment shown in FIG. 1. Non-integer divider 21 further includes a synchronizer coupled to receive a fifth signal, the fifth signal being produced by the first divider, wherein the synchronizer is configured to output the second signal. Synchronizer 214 may be any suitable type of synchronizer.

In the embodiment of FIG. 2, the fifth signal is output by divider 113 to synchronizer 214, which in turn outputs the second signal to mixer 110. The synchronizer also includes a clock input coupled to receive the first signal, $f_{in}$. Thus, synchronizer 214 synchronizes the signal output from divider 113 with the first signal, $f_{in}$. Implementing non-integer divider 21 using synchronizer 214 as shown in FIG. 2 may reduce the power of spurs, which occur at the frequencies of $f_{out}+f_{in}/N$ and $f_{out}-f_{in}/N$. Moreover, the reduction of the power of spurs in this embodiment is achieved without increasing power consumption significantly.

Figure 3:
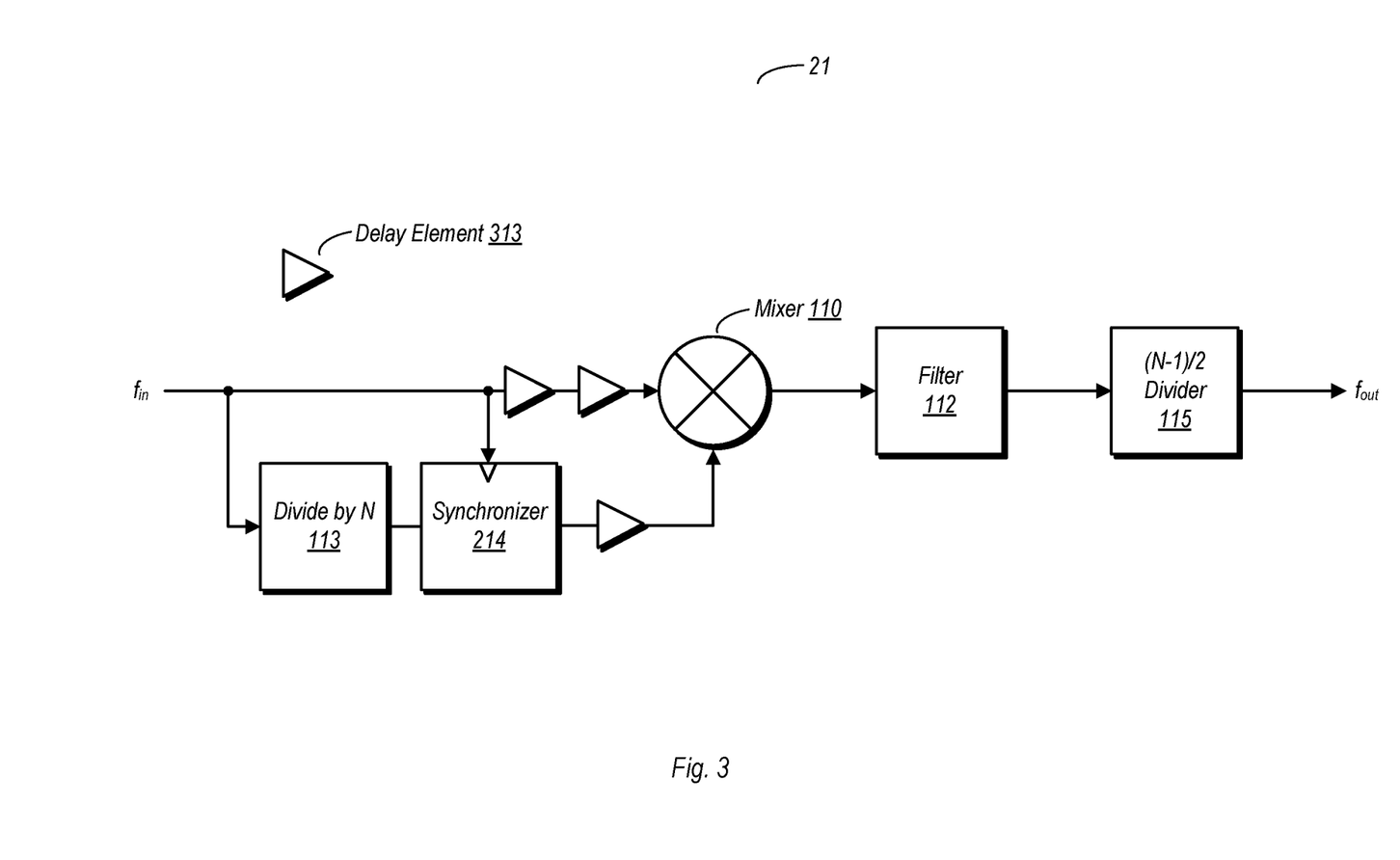
FIG. 3 is a block diagram of another embodiment of a non-integer divider.

FIG. 3 is a block diagram of another embodiment of a non-integer divider. In the embodiment shown, non-integer divider 31 includes all of the same components as the embodiments discussed above. In addition, non-integer divider 31 includes at least one delay element 313 coupled between an output of the synchronizer and the second input of the mixer, and further includes one or more delay elements 313 to apply delay to the first signal prior to input of the first signal to the mixer. In this embodiment, wherein the first signal is input without delay into the first divider, and further, is input without delay to the clock input of synchronizer 214.

The delay elements 313 may be implemented using any suitable type of delay element circuitry. Furthermore, the number and/or types of delay elements in each signal path may vary from one embodiment to the next. The use of these delay elements may allow further precision in matching the delay of the first signal into the first input of mixer 110 to that of the second signal into the second input of mixer 110 (e.g., as output from synchronizer 214 in this embodiment). This may further aid in suppressing spur power and avoiding the generation of other undesirable frequency components.

Figure 4:
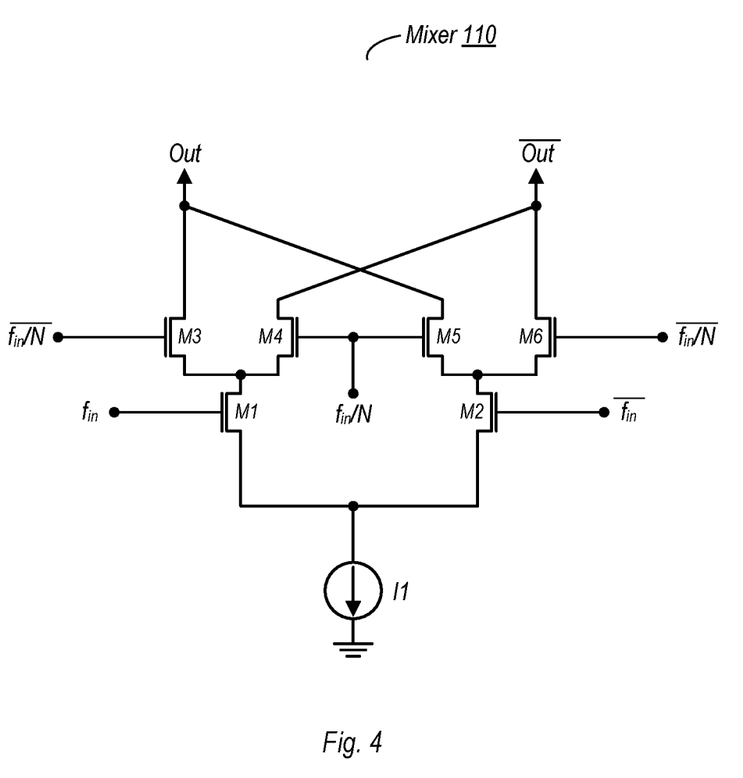
FIG. 4 is a schematic of one embodiment of a mixer used in a non-integer divider.

FIG. 4 is a schematic of one embodiment of a mixer used in a non-integer divider. In the embodiment shown, mixer 110 is coupled to receive the first signal, $f_{in}$, on the gate input of M1, while a complement of the first signal is received on the gate terminal of M2. The second signal is input into mixer 110 on the gate terminals of M4 and M5. Meanwhile, the complement of the second signal is input to mixer 110 on the gate terminals of M3 and M6. Mixer 110 in the embodiment shown is arranged to provide the third signal (the output of mixer 110) as a differential signal Out from the drain terminal of M3 and the complement of Out from the drain terminal of M6. A current source I1 draws current through both branches of the circuit.

In the embodiment shown, the mismatch between M1 and M2 is less critical than the mismatch between the other devices, hence the reasoning for inputting the first signal (which is the higher frequency input signal) through these devices. Furthermore, these devices can be sized smaller than the other devices, and thus using M1 and M2 as input devices for the higher frequency input signal may reduce power consumption by mixer 110.

Figure 5:
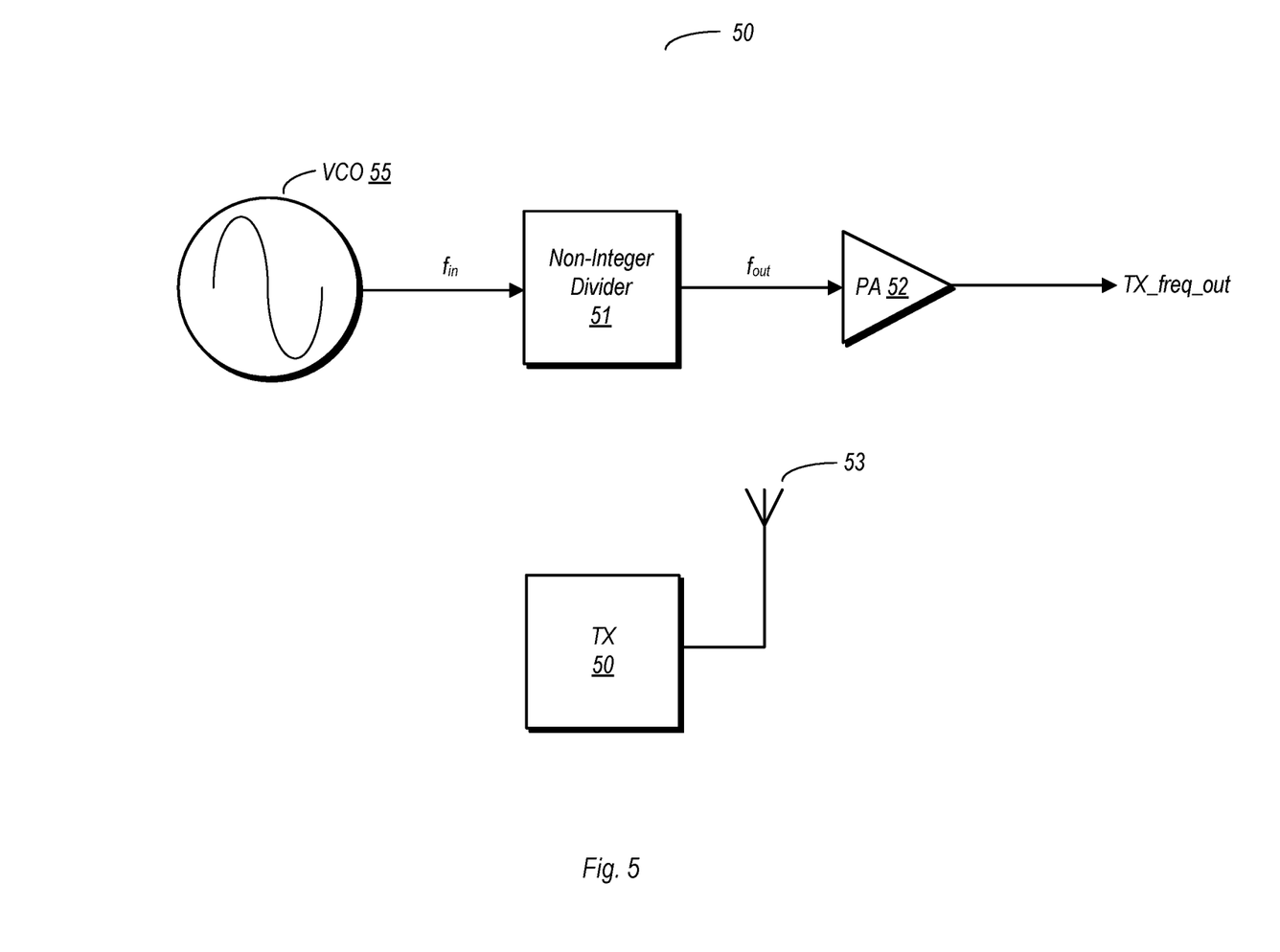
FIG. 5 is a block diagram of a portion of a transmitter including a non-integer divider.

FIG. 5 is a block diagram of a portion of a transmitter including a non-integer divider. Transmitter system 50 is shown here in a simplified form for the sake of illustrations, although it is to be understood that other components may be present in various embodiments.

Transmitter system 50 in the embodiment shown includes an oscillator to generate a first signal having a first frequency. Transmitter system 50 an oscillator configured to generate a first signal (e.g., $f_{in}$) having a first frequency. In this embodiment, the oscillator is voltage controlled oscillator (VCO) 55, although embodiments utilizing other types of oscillators are possible and contemplated. Transmitter system 50 further includes a non-integer divider unit including circuitry to divide the first frequency by a non-integer value. In the embodiment shown, non-integer divider 51 may be any one of the previously discussed non-integer dividers, or another embodiment not explicitly discussed herein but nevertheless falling within the scope of this disclosure. The non-integer divider 51 includes a first divider coupled to receive the first signal and arranged to divide the first frequency to produce a second signal having a second frequency. The non-integer divider 51 includes a mixer having a first input coupled to receive the first signal and a second input coupled to receive the second signal. The mixer is arranged to output a third signal having a third frequency, wherein a frequency of the third signal is based on the first frequency and the second frequency. A second divider of non-integer 51 is coupled to receive the third signal and arranged to divide the third frequency to produce a fourth signal having a fourth frequency, wherein a ratio of the first frequency to the fourth frequency is a non-integer value.

Figure 6:
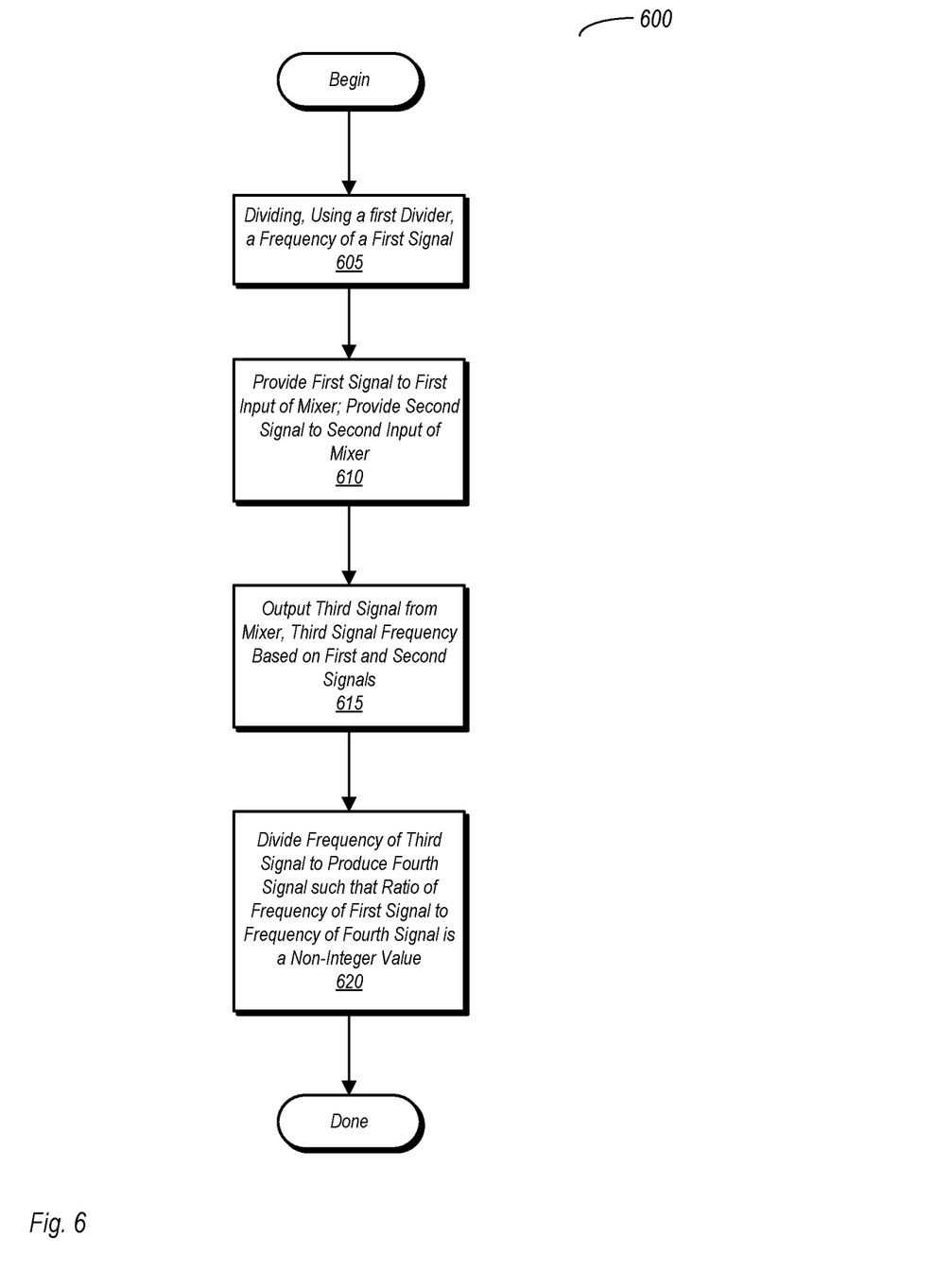
FIG. 6 is a flow diagram of one embodiment of a method for operating a non-integer divider.

A power amplifier (e.g., power amplifier 52) is coupled to receive the fourth signal from the non-integer divider 51. The output signal from power amplifier 52, TX_freq_out, is a transmitter may be a center frequency of a signal transmitted by transmitter 50 system 50. Transmitter system 50 further includes an antenna (e.g., antenna 53) coupled to receive the signal from the power amplifier having frequency equivalent to the fourth frequency. The power amplifier is configured to cause transmission of a radio signal having a carrier frequency equivalent to the fourth frequency FIG. 6 is a flow diagram of one embodiment of a method for operating a non-integer divider. Method 600 in the embodiment shown may be conducted by any of the various hardware/circuit embodiments discussed above, as well as other embodiments not explicitly discussed herein.

Method 600 includes dividing, using a first divider, a frequency of a first signal (block 605). This may include the first divider dividing the frequency of the first signal by an odd integer value N. In some embodiments, the non-integer divider includes a synchronizer, and thus the method may include a synchronizer receiving a signal output by the first divider, the synchronizer receiving the first signal on a clock input, and the synchronizer outputting the second signal to the second input of the mixer. In some embodiments of a non-integer divider, one or more delay elements may be present in the signal paths leading to the mixer inputs. Accordingly, some embodiments of method 600 may include one or more delay elements applying delay to the first signal prior to inputting into the first input of the mixer and one or more additional delay elements applying delay to the second signal prior to inputting into the second input of the mixer.

Method 600 further includes providing the first signal to first input of a mixer and a second signal to a second input of the mixer, the second signal having a frequency equivalent to a signal output by the first divider (block 610), the mixer outputting a third signal having a frequency based on the first and second signals (block 615). Various embodiments of a non-integer divider include a filter coupled to the output of the mixer. Accordingly, various embodiments of method 600 may include attenuating upper sideband components of the third signal using a filter. Thereafter, the method includes a second divider dividing a frequency of the third signal to produce a fourth signal, wherein a ratio of the frequency of the first signal to a frequency of the fourth signal is a non-integer value (block 620). In some embodiments, the method includes the second divider dividing the frequency of the third signal by an even integer value (N−1)/2, wherein a ratio of the frequency of the first signal to the frequency of the fourth signal is N/2.

Figure 7:
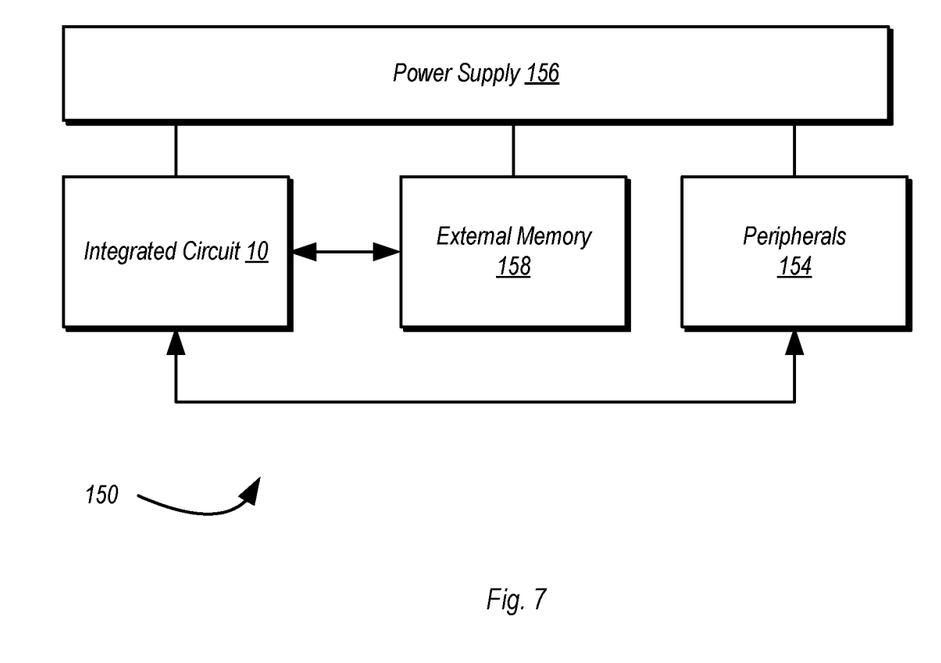
FIG. 7 is a block diagram of one embodiment of an exemplary system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.). In some embodiments, the peripherals 154 may include radio transmitter circuitry that includes various embodiments of the circuitry discussed above with reference to FIGS. 1-5, and capable of carrying out various embodiments of the method discussed above with reference to FIG. 6.

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a first divider configured to divide a frequency of a first signal;
   a mixer having a first input configured to receive the first signal and a second input coupled to receive a second signal, wherein a frequency of the second signal is equivalent to a signal output by the first divider, wherein the mixer is configured to output a third signal having a frequency based on signals received at its first and second inputs;
   a filter configured to attenuate sideband components of the third signal;
   a second divider configured to divide a frequency of the third signal to produce a fourth signal, wherein a ratio of the frequency of the first signal to a ratio of the fourth signal is a non-integer value; and
   a power amplifier coupled to receive the fourth signal.

2. The apparatus as recited in claim 1, wherein the first divider is configured to divide the frequency of the first signal by an odd integer value.

3. The apparatus as recited in claim 1, wherein the second divider is configured to divide the frequency of the third signal by an even integer value.

4. The apparatus as recited in claim 1, wherein the first divider is configured to divide the frequency of the first signal by an odd integer value N, wherein the second divider is configured to divide the frequency of the third signal by a value of (N−1)/2, and wherein a ratio of the frequency of the first signal to the frequency of the fourth signal is N/2.

5. The apparatus as recited in claim 1, further comprising a synchronizer coupled to receive a fifth signal, the fifth signal being produced by the first divider, wherein the synchronizer is configured to output the second signal.

6. The apparatus as recited in claim 5, wherein the synchronizer includes a clock input coupled to receive the first signal.

7. The apparatus as recited in claim 5, further comprising at least one delay element coupled between an output of the synchronizer and the second input of the mixer.

8. The apparatus as recited in claim 1, further comprising one or more delay elements configured to apply delay to the first signal prior to input of the first signal to the mixer, wherein the first signal is input without delay into the first divider.

9. A method comprising:
   dividing, using a first divider, a frequency of a first signal;
   a synchronizer receiving a signal output by the first divider;
   the synchronizer receiving the first signal on a clock input;
   providing the first signal to first input of a mixer and a second signal to a second input of the mixer, the second signal having a frequency equivalent to a signal output by the first divider, wherein the second signal is output from the synchronizer to the second input of the mixer;
   the mixer outputting a third signal having a frequency based on the first and second signals; and
   a second divider dividing a frequency of the third signal to produce a fourth signal, wherein a ratio of the frequency of the first signal to a frequency of the fourth signal is a non-integer value.

10. The method as recited in claim 9, further comprising:
    the first divider dividing the frequency of the first signal by an odd integer value N; and
    the second divider dividing the frequency of the third signal by an even integer value (N−1)/2;
    wherein a ratio of the frequency of the first signal to the frequency of the fourth signal is N/2.

11. The method as recited in claim 9, further comprising:
    one or more delay elements applying delay to the first signal prior to inputting into the first input of the mixer; and
    one or more additional delay elements applying delay to the second signal prior to inputting into the second input of the mixer.

12. The method as recited in claim 9, further comprising a filter attenuating sideband components of the third signal using a filter.

13. A system comprising:
    an oscillator configured to generate a first signal having a first frequency;

a non-integer divider unit comprising circuitry configured to divide the first frequency by a non-integer value, wherein the non-integer divider unit includes:
   a first divider coupled to receive the first signal and configured to divide the first frequency to produce a second signal having a second frequency;
   a mixer having a first input coupled to receive the first signal and a second input coupled to receive the second signal, wherein the mixer is configured to output a third signal having a third frequency, wherein a frequency of the third signal is based on the first frequency and the second frequency; and
   a second divider coupled to receive the third signal and configured to divide the third frequency to produce a fourth signal having a fourth frequency, wherein a ratio of the first frequency to the fourth frequency is a non-integer value; and
a power amplifier coupled to receive the fourth signal from the non-integer divider unit.

14. The system as recited in claim 13, wherein the non-integer divider unit includes a synchronizer, wherein the synchronizer is coupled to receive the third signal and further includes a clock input coupled to receive the first signal, wherein the synchronizer is configured to output the second signal.

15. The system as recited in claim 13, wherein the first divider is configured to divide the frequency of the first signal by an odd integer value N, wherein the second divider is configured to divide the frequency of the third signal by a value of (N−1)/2, and wherein a ratio of the frequency of the first signal to the frequency of the fourth signal is N/2.

16. The system as recited in claim 13, further comprising a filter configured to attenuate sideband components of the third signal.

17. The system as recited in claim 13, further comprising a plurality of buffers including at least one buffer configured to apply delay to the first signal and at least one buffer configured to apply delay to the second signal.

18. The system as recited in claim 13, further comprising an antenna coupled to receive a signal from the power amplifier having frequency equivalent to the fourth frequency, wherein the power amplifier is configured to cause transmission of a radio signal having a carrier frequency equivalent to the fourth frequency.

19. The apparatus as recited in claim 1, further comprising:
   a transmitter including the power amplifier; and
   an antenna, wherein the transmitter is configured to transmit a radio signal having a carrier frequency equivalent to a frequency of the fourth signal.

20. The method as recited in claim 9, further comprising providing the fourth signal to a power amplifier.

* * * * *